Figure 1:
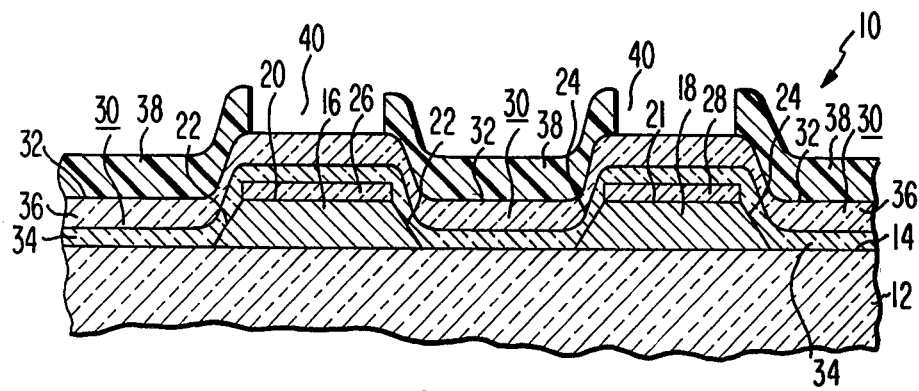

United States Patent [19]

Hsu

[11] 4,199,384
[45] Apr. 22, 1980

[54] METHOD OF MAKING A PLANAR SEMICONDUCTOR ON INSULATING SUBSTRATE DEVICE UTILIZING THE DEPOSITION OF A DUAL DIELECTRIC LAYER BETWEEN DEVICE ISLANDS

[75] Inventor: Sheng T. Hsu, Lawrenceville, N.J.

[73] Assignee: RCA Corporation, New York, N.Y.

[21] Appl. No.: 7,579

[22] Filed: Jan. 29, 1979

[51] Int. Cl.$^2$ .................. H01L 21/205; H01L 21/84; H01L 29/04
[52] U.S. Cl. ...................................... 148/174; 148/1.5; 148/175; 156/648; 156/649; 156/653; 156/657; 357/4; 357/52; 357/54; 357/59; 427/85; 427/86; 427/93; 427/255.3; 427/255.7
[58] Field of Search ............... 148/1.5, 174, 175, 187; 427/85, 86, 93, 248 B, 248 C, 248 J; 156/648, 649, 653, 657, 662; 357/4, 52, 54, 59

[56] References Cited

U.S. PATENT DOCUMENTS

| 3,445,303 | 5/1969 | Engbert | 357/56 X |
| 3,484,662 | 12/1969 | Hagon | 148/175 X |
| 3,740,280 | 6/1973 | Ronen | 156/649 |
| 3,791,024 | 2/1974 | Boleky | 148/175 X |
| 3,859,127 | 1/1975 | Lehner | 156/648 X |
| 3,971,061 | 7/1976 | Matsushita et al. | 357/52 |
| 4,014,037 | 3/1977 | Matsushita et al. | 357/52 |
| 4,086,613 | 4/1978 | Biet et al. | 357/54 |
| 4,142,926 | 3/1979 | Morgan | 156/653 X |

FOREIGN PATENT DOCUMENTS 1160744 8/1969 United Kingdom .................... 357/4 X

OTHER PUBLICATIONS

Capell et al., "Processing . . . C-MOS on Sapphire . . . ," Electronics, May 26, 1977, pp. 99-105.
Tarng, M. L., "Carrier Transport . . . Polycrystal- line-Silicon Films," J. Appl. Phys., vol. 49 (7), Jul. 1978, pp. 4069-4075.
Hamasaki et al., "Crystallographic . . . Polycrystalline Silicon . . . ," Ibid., vol. 49 (7), Jul. 1978, pp. 3987-3992.
Hamasaki et al., "Electronic Properties . . . Polycrystalline-Silicon . . . ," Solid State Communications, vol. 21, 1977, pp. 591-593.
Matsushita et al., "Semi-Insulating Polycrystalline-Silicon . . . ," Proc. 7th Conf. Solid-State Devices, Tokyo, 1975, Jap. J. Appl. Phys., vol. 15, 1976, pp. 35-40.
Mochizvki et al., "Semi-Insulating Polycrystalline Silicon . . . ," Ibid., vol. 15, 1976, pp. 41-48.
Cullen et al., Editors, *Heteroepitaxial Semiconductors for Electronic Devices*, Textbook, Springer-Verlag, N.Y., Berlin, Chapter 2, pp. 64-74.

*Primary Examiner*—L. Dewayne Rutledge
*Assistant Examiner*—W. G. Saba
*Attorney, Agent, or Firm*—H. Christoffersen; D. S. Cohen; L. P. Benjamin

[57] ABSTRACT

A method of making a monolithic semiconductor-on-insulator device which includes silicon islands in spaced relation on the surface of an insulating substrate includes the steps of filling the spaces between the islands with a passivating material by first depositing a layer of a semi-insulating material on the surface of the substrate and extending between adjacent islands into contiguous relation with the side surfaces thereof and then depositing a layer of insulating material on the layer of semi-insulating material. The combined thicknesses of the layers of semi-insulating and insulating material is substantially the same as the thickness of the silicon islands so that the resulting device has a substantially planar surface.

4 Claims, 2 Drawing Figures

METHOD OF MAKING A PLANAR SEMICONDUCTOR ON INSULATING SUBSTRATE DEVICE UTILIZING THE DEPOSITION OF A DUAL DIELECTRIC LAYER BETWEEN DEVICE ISLANDS

This invention relates to monolithic semiconductor-on-insulating-substrate devices, e.g. silicon-on-sapphire devices, and particularly to a method of making these devices in so-called planar form.

Some known silicon-on-sapphire devices have spaced islands of silicon on the surface of a sapphire substrate in which islands the active devices of a circuit are formed. The islands are typically of mesa shape, having a flat top surface parallel to the surface of the substrate and side surfaces extending at an angle to the substrate. Isolation is provided by the insulating substrate and the air in the spaces between the islands, and both the top surfaces and the side surfaces of the islands are oxidized to provide a passivating coating of silicon dioxide. Significant problems have existed in these devices which have been traced at least in part to the material adjacent to the side edges of the islands, when this material is intercepted by the boundaries of the channel region of an MOS device in the island and when conductive material, particularly gate material, extends over the oxide on the side edges. Effectively, the side edges provide transistors in parallel with the transistor defined by the top surface. The characteristics of the "side transistors" are different from those of the top surface transistors and render the operation of the device unpredictable.

Silicon-on-sapphire devices are also known in which passivating material occupies the spaces between the islands. These devices are called "coplanar devices" because the upper surfaces of the islands and the surface of the insulating material are arranged to be substantially coplanar. One important advantage of this arrangement is that the "side transistor" problem is largely eliminated. Moreover, these devices have no large steps over which metallization must extend so that manufacturing yields are improved.

One well-known method for making coplanar silicon-on-sapphire devices is known as the "LOSOS" process. See *Electronics Magazine* for May 26, 1977 at page 101. This process is characterized by a step of locally etching a continuous epitaxial layer of silicon to a depth of about half its thickness in the areas intended to become the passivating layer and then oxidizing this material through to the substate. The side edges of the silicon islands are also oxidized during this step. The resulting oxide layer is approximately twice the thickness of the silicon which was oxidized so that the surface of the oxide becomes substantially coplanar with the surfaces of the unoxidized remaining silicon. This process is quite useful in providing passivation of relatively high dielectric strength, but the resulting devices still exhibit problems of instability associated with the material of the silicon islands adjacent to their side edges and the oxidation of part of this material.

The LOSOS process also has the disadvantage that precise control of several steps of the process is required in order to achieve the planar structure. In particular, the step of etching the silicon to half its thickness must be controlled precisely, and precise control is also required for the oxidizing step which follows. Moreover, an extremely clean oxidation process is required in the LOSOS process to prevent ion contamination of the thermally grown oxide.

The present process eliminates edge instability in the resulting product while retaining high dielectric strength. A better planar structure can be obtained by forming the passivating substances by chemical vapor deposition, a process which is easier to control than either etching or thermal oxidation.

Figure 2:
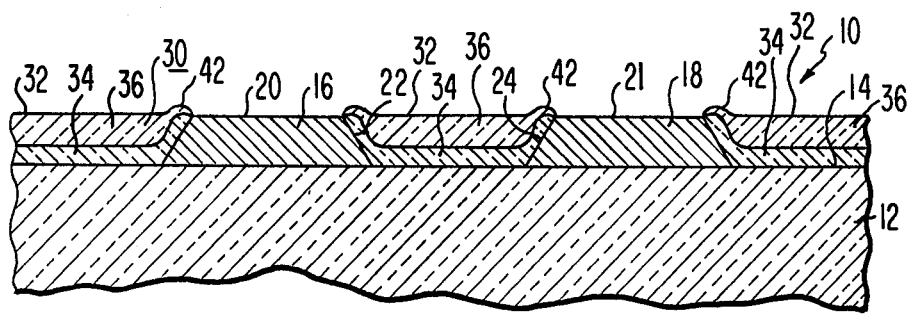

In the drawings:

FIGS. 1 and 2 are partial cross-sectional views illustrating various steps in the present process.

Knowledge of the details of the integrated circuit device which can be made by the present method is not required for an understanding of the present method. Once the steps of the present method have been accomplished, any known process of treating the device to make circuit elements may be undertaken.

A partial cross-section of an integrated circuit device 10 at an early stage of the present method is shown in FIG. 1. The device 10 has a substrate 12 of an insulating material capable of promoting the epitaxial growth of silicon. The substrate 12 is usually of monocrystalline sapphire, although such materials as spinel and beryllium oxide are also suitable. The substrate 12 has a surface 14 which is oriented as known in the art so as to be capable of supporting the epitaxial growth of silicon with a desired orientation. Preferably, the surface 14 is oriented parallel, within manufacturing tolerances, to a ($1\bar{1}02$) crystallographic plane of the substrate 12 in which case the resulting silicon will have its (100) planes parallel to the surface 14.

Two silicon islands 16 and 18, which may be two out of thousands or even tens of thousands of such islands in a given device, are shown on the surface 14. The islands 16 and 18 are epitaxially related to the substrate 12 and are spaced from each other. The islands 16 and 18 are 0.05 to 1.5 micrometers ($\mu$m) thick, preferably about 0.6 $\mu$m, and have upper surfaces 20 and 21, respectively, which are coplanar owing to the fact that the islands 16 and 18 were originally part of a continuous layer of silicon, not shown as such. The islands 16 and 18 also have side surfaces 22 and 24, respectively. It is generally known in this art that the material of the islands adjacent to these side surfaces 22 and 24 has characteristics different from those of the material adjacent to the upper surfaces 20 and 21 and that this side surface material is responsible for many unstable conditions in these devices.

As it has been described so far, the device 10 can be made by any method known in the art. Usually, the islands 16 and 18 are defined by etching using a patterned silicon dioxide mask, portions of which are shown at 26 and 28 on the islands 16 and 18, respectively. An anisotropic etchant is usually employed to produce the islands, and this produces the sloped side edges 22 and 24 substantially as shown.

After the islands have been defined, the spaces between the islands, designated generally by the numeral 30, are filled with a passivating material which has qualities which substantially eliminate edge instability effects in the islands 16 and 18. Like the structure which results from the LOSOS process, the passivating material is arranged to have an upper surface 32 which is substantially coplanar with the upper surfaces 20 and 21 of the islands 16 and 18.

In its preferred form, the passivating material comprises a layer 34 which has a thickness less than the thickness of the islands 16 and 18 and which may be described generally as being of semi-insulating material. The layer 34 of semi-insulating material is deposited by chemical vapor deposition techniques onto the surface 14 of the substrate 12, the side edges 22 and 24 of the islands 16 and 18, and the masking coating 26 and 28, which is preferably retained after the island etching step. The passivating material also comprises a layer 36 of insulating material, preferably chemically vapor deposited silicon dioxide, which has a thickness equal to the balance of the thickness of the islands 16 and 18, that is, a thickness equal to the thickness of the islands less the thickness of the layer 34. The thicknesses of the layers 34 and 36 can be relatively easily controlled in the chemical vapor deposition process so that a good coplanar relationship can be achieved.

The material which is selected for the layer 34 of semi-insulating material can take any one of several forms. The electrical characteristics of this material should be such that it is generally semi-insulating but has some finite conductivity. Its conductivity should be high enough so that charge cannot accumulate in the material adjacent to the side edges 22 and 24 of the islands 16 and 18, but its conductivity should be low enough so that any leakage currents which might flow through the layer 28 between the island 16 and the island 18 remain below an amount which would render the circuit of the device nonoperative. A layer 28 having a sheet resistivity between about $1 \times 10^{10}$ ohms/$\square$ and about $1 \times 10^{14}$ ohms/$\square$ meets these criteria.

Although any material which meets the above criteria may be used for the layer 34 in the device 10, a preferred material is a modified polycrystalline silicon material which is known in the art as "SIPOS" (Semi-Insulating Polycrystalline Oxygen-doped Silicon). This material can be made to have a sheet resistivity greater than $1 \times 10^{13}$ ohms/$\square$ if the concentration of oxygen in the layer is higher than 30 atomic percent. The material of the layer 34 may also be undoped amorphous silicon or polycrystalline silicon so long as care is taken to keep its resistivity within the desired limits.

SIPOS is generally deposited by chemical vapor deposition techniques which are known to the art. The deposition temperature is relatively low, for example, about 650° C. The constituents of the deposition atmosphere may be silane, $SiH_4$, as a source of silicon, nitrous oxide, $N_2O$, as a source of oxygen, and an inert nitrogen carrier. The relative proportions of the silane and nitrous oxide and their flow rates through the deposition reactor may be easily controlled to establish the desired level of oxygen doping in the layer 34.

The silicon dioxide layer 36 can also be deposited from known reactants and in the same deposition reactor. For example, after the layer 34 has been formed to the desired thickness, the flow of nitrous oxide can be terminated and a flow of oxygen, $O_2$, substituted. This will change the depositing species from SIPOS to silicon dioxide.

The semi-insulating layer 34 and the insulating layer 36 are deposited over the entire surface of the device 10. Those portions of these layers which are over the islands 16 and 18 are undesired in the final structure of the device. Removal of these portions is accomplished by first spinning on a photoresist coating 38 and then exposing and developing this coating to leave openings 40 above the islands 16 and 18. The device 10 is then immersed in a solvent for silicon dioxide to remove the exposed portions of the layer 36 of silicon dioxide. Any known silicon dioxide etchant may be used, buffered hydrofluoric acid being preferred. This etching step will be self-limiting because the hydrofluoric acid etchant does not attack the SIPOS material to any substantial extent.

After completion of the silicon dioxide etching step, the device 10 is immersed in a solvent for the SIPOS layer 34. Again, any suitable solvent may be used, and in this case, hot phosphoric acid is preferred. This etching step will also be self-limiting owing to the presence of the silicon dioxide masking layers 26 and 28. Note that the silicon dioxide masking layers 26 and 28 must be retained in order to reserve the self-limiting etching feature because the known solvents for SIPOS will also attack silicon. The silicon dioxide masking layers 26 and 28 could be removed prior to the deposition of the layers 34 and 36 if a selective solvent for SIPOS which does not attack silicon were employed.

After the completion of the SIPOS etching step, the device 10 is returned to a solvent for silicon dioxide in order to remove the masking layers 26 and 28. When this step is complete, the photoresist layer 38 is removed, and the result is as shown in FIG. 2. The upper surfaces 20 and 21 of the islands 16 and 18, respectively, will have been exposed. The layers 34 and 36 now fill the spaces 30 between the islands and extend between the side edges 22 and 24 thereof. The surface 32 of the silicon dioxide layer 36 will be substantially coplanar with the surfaces 20 and 21 of the islands 16 and 18. A mathematically flat surface will not be achieved, however, because the etching conditions at the boundaries of the openings 40 in the photoresist layer 38 are such that ridges, here indicated at 42, will usually result. Proper control of etching times will keep the height of these ridges to a minimum, however.

At this point, the present process is substantially complete. As mentioned above, the device 10 may now be processed in any known way to fabricate an integrated circuit device. For example, the steps of the LOSOS process beyond the step of locally oxidizing the silicon to produce the passivating material may be employed.

The device 10 constructed in accordance with the principles described in this application has been found to be free of edge instability effects. This advantageous result is believed to be attributable to the electrical qualities of the semi-insulating layer 34. Because of its finite conductivity, this material cannot hold charge which charge, if present, could induce undesirable conduction paths, via the field effect, in the edge-adjacent zones of the islands 16 and 18. Because of its finite conductivity, the layer 34 might be regarded as a source of difficulty in providing leakage current paths between adjacent islands, but it has been found that although some leakage may take place, its magnitude is comparable with or lower than leakage currents found in conventionally fabricated devices. Further, the dielectric strength of the combination of the semi-insulating layer 28 and the deposited oxide layer 30 has been found to be as good as the dielectric strength of the oxide formed in the known LOSOS process. In addition, good coplanarity can be achieved in the present process in a relatively easy manner. Thus, devices fabricated in accordance with the present disclosure can be expected to have improved yields in manufacturing.

What is claimed is:

1. A method of making a planar silicon-on-insulating-substrate device of the type having a plurality of silicon islands spaced apart on a plane surface of an insulating substrate, said islands having a predetermined thickness, and having coplanar surfaces parallel to the surface of the substrate and side surfaces at an angle to the substrate, said method comprising the steps of depositing on the surface of the substrate in the spaces between the islands a layer of a semi-insulating material having a thickness less than the thickness of the islands, and depositing on the layer of semi-insulating material a layer of insulating material having a thickness substantially equal to the balance of the thickness of said islands so as to form a surface substantially coplanar with the coplanar surfaces of said islands.

2. A method as defined in claim 1 wherein the semi-insulating material is SIPOS and is formed by chemical vapor deposition at a temperature of about 650° C. from silane, $SiH_4$, and nitrous oxide, $N_2O$.

3. A method as defined in claim 2 wherein the amount of nitrous oxide is controlled such that the resulting SIPOS film has an oxygen concentration in excess of 30 atomic percent.

4. A method as defined in claim 1 wherein the silicon islands are defined by masked etching utilizing a defined silicon dioxide mask and wherein the depositing steps of claim 1 are carried out by after completion of an island etching step and without removing the silicon dioxide mask, chemically vapor depositing a continuous layer of the semi-insulating material onto the surface of the substrate, the side surfaces of the islands, and the silicon dioxide mask, chemically vapor depositing a continuous layer of silicon dioxide on the layer of semi-insulating material, applying a masking coating to the layer of silicon dioxide to protect those portions of the two layers which are to be retained, and then removing the unmasked portions of the silicon dioxide layer, the semi-insulating layer, and the masking coating by etching in a sequence of solvents for the respective materials.

* * * * *